(12) United States Patent
Legrady

(10) Patent No.: US 6,402,531 B1
(45) Date of Patent: Jun. 11, 2002

(54) CAPILLARY ACTION ENHANCED SURFACE MOUNT PIN HEADER

(75) Inventor: Janos Legrady, Putnam Valley, NY (US)

(73) Assignee: Zierick Manufacturing Corp., Mount Kisco, NY (US)

( * ) Notice: Subject to any disclaimer, the term of this patent is extended or adjusted under 35 U.S.C. 154(b) by 0 days.

(21) Appl. No.: 09/166,632

(22) Filed: Oct. 5, 1998

(51) Int. Cl.$^7$ ............................. H01R 12/00; H05K 1/00
(52) U.S. Cl. ......................................... 439/83; 439/876
(58) Field of Search ................. 439/83, 876; 228/180.1, 228/258

(56) References Cited

U.S. PATENT DOCUMENTS 4,723,925 A * 2/1988 Orr, Jr. et al. ............... 439/877
5,669,783 A * 9/1997 Inoue et al. .................. 439/331

\* cited by examiner

*Primary Examiner*—Neil Abrams
*Assistant Examiner*—Michael C. Zarroli
(74) *Attorney, Agent, or Firm*—Lackenbach Siegel, LLP

(57) ABSTRACT

A capillary action enhanced surface mount pin header includes a first flat substrate provided with a predetermined array of plated-through holes having substantially parallel and each having an internal surface defining a first substantially uniform cross section. Pins are provided each of which defines a longitudinal axis and having one end extending through an associated plated-through hole and another end extending to one side of said first substrate. Each pin has an external surface on at least a portion thereof which is received within an associated plated-through hole which defines a second substantially uniform cross section. In the disclosed embodiment, the pins have square or hexagonal cross sections while the plated-through holes have circular cross sections. The first and second cross sections are dissimilar and configured to provide spaced lines of contact and elongate channels substantially parallel to the axes between the internal and external surfaces and adjacent lines of contact, dimensioned to promote capillary action for molten solder at a channel opening on one side of the first substrate to cause the solder to be drawn through the channels towards the opposite side of the first substrate. A second substantially flat substrate is provided for positioning the solder at points substantially aligned with points on the predetermined array and proximate to at least one channel in at least one plated-through hole prior to melting of the solder.

20 Claims, 5 Drawing Sheets

CAPILLARY ACTION ENHANCED SURFACE MOUNT PIN HEADER

BACKGROUND OF THE INVENTION

1. Field of the Invention

The invention generally relates to electronic connectors and, more specifically, to a capillary action enhanced surface mount pin header.

2. Description of the Prior Art

Traditionally, electrical components and particularly connectors, such as pins, have been mounted on printed circuit boards (PCBs) by extending the leads of the component or the leg portion of an upstanding pin through apertures in the board and soldered to the circuit board. The traditional approach has commonly been referred to as "through-the-hole" (TTH) technology.

TTH technology has, however, been gradually replaced, for most applications, with surface mount technology (SMT), in which components as well as contacts/connectors are mounted on a surface of a PCB without forming or using apertures or holes in the circuit board. Electronic components frequently mounted in this manner include semiconductor components, capacitors, resistors and even coils or tuned circuits. However, while SMT technology allows for rapid and efficient mounting of components on a PCB, it does present a few problems which need to be overcome in order to effectively use the technology. For one, components need to initially be accurately positioned on the lands or pads on the PCB. During such population of the board, particularly in high density configurations, the components need to be stable in their positions both before and during re-flow of solder so that the components will ultimately be fixed in desired positions or locations, as tolerances may be critical. This requires that such locations do not "shift" prior to re-solder and particularly during re-solder when the components literally "float" on a layer of molten solder. This problem has been addressed, at least for individual pins, in applicant's U.S. Ser. No. 08/600,112 for "Capillary Action Promoting Surface Mount Connectors" in which a surface mount pin assembly consists of a drawn wire pin placed within an outer eyelet. The cross sectional configurations of the wire pin and eyelet form a plurality of channels spaced about the pin that promote capillary action when the eyelet is placed on a land or pad of a printed circuit board on which wire paste has been deposited and the solder re-flowed. The solder is drawn, by capillary action, up into the channels or spaces between the pin and the eyelet, removing some of the molten solder from the pad, drawing the surface mount pin assembly towards the pad or land. This provides a good electrical and mechanical connection between the surface mount pin assembly and the printed circuit board and enhances the mechanical and electrical integrity between the wire pin and the eyelet. While such surface mount pins are useful, there are numerous instances when a multiplicity of such pins must be mounted on a printed circuit board in a pin grid array. The placement of a multiplicity of such pins is both time-consuming and requires that the pins be precisely positioned on the lands, and the stability of such pins be maintained both before and after re-flow of solder. This is particularly true with high density mounting techniques which have been used in recent years in which the number of such pins or terminals per unit area has significantly increased. In some instances, header assemblies have been used to maintain the spatial relationships of a multiplicity of such pins as well as to facilitate their rapid placement on a printed circuit board.

A method of mounting surface connectors has been proposed in U.S. Pat. No. 5,303,466, where a series of pins are surface mounted on electrical pads or conductors of a printed circuit board. An insulator, which serves as a header, receives the various pins. However, the holes in the header are not plated and solder is not received within the holes by means of capillary action. The patentee proposes to initially mount the pins on the circuit board while the pins are aligned by dummy contacts and fixed to the circuit board by means of solder. It is only after the pins are mounted that the insulator is placed on the board for receiving the mating contacts in order to protect the contacts from being accidentally damaged. The insulator, therefore, does not serve any electrical function and does not serve to enhance the solder connection between the pins and the printed circuit board.

SUMMARY OF THE INVENTION

It is, according, an object of the present invention to provide a surface mount pin header which does not have the disadvantages associated with prior art headers.

It is another object of the present invention to provide a surface mount pin header which utilizes capillary action to draw the header towards the solder-coated pads or lands on a printed circuit board to prevent the header from undesired shifts of position or movements due to floating on the molten solder during re-flow.

It is still another object of the present invention to provide a surface mount pin header as in the previous objects that facilitates and speeds the attachment, by surface mounting techniques, of pin headers carrying a multiplicity of pins or other contacts.

It is yet another object of the present invention to provide a surface mount pin header that can be used to mount electrical pins and other contacts arranged in a high density array.

It is a further object of the present invention to provide a surface mount pin header of the type under consideration that can mount a great number of contacts onto a circuit board with high reliability.

It is still a further object of the present invention to provide a surface mounting method to mount high density pin arrays onto a printed circuit board while ensuring stability and positional integrity of all the pins or contacts.

It is yet a further object of the present invention to provide a surface mount pin header that exhibits a significantly higher pin retention force compared with J-lead type surface mount headers.

It is an additional object of the present invention to provide a surface mount pin header that exhibits flexibility so that a degree of board warpage is permissible and co-planarity problems are minimized.

It is still an additional object of the present invention to provide a surface mount pin header that provides a visual indicator that proper mounting has been effected, thereby providing higher quality assurance of production.

It is yet an additional object of the present invention to provide a surface mount pin header as in the previous objects that exhibits high resistance to thermal shock and thermal cycling.

In order to achieve the above objects, as well as others which will become apparent hereinafter, a surface mount pin header in accordance with the present invention, which promotes capillary action, comprises a first substantially flat substrate provided with a predetermined array of plated-through holes having substantially parallel axes and each having an internal surface defining a first substantially uniform cross section. A plurality of pins are provided each defining a longitudinal axis and having one end extending through an associated plated-through hole and another end extending from one side of said first substrate. Each said pin has an external surface on at least said one end or portion thereof received within an associated plated-through hole that defines a second substantially uniform cross section. Said first and second cross sections are dissimilar and configured to provide spaced lines of contact and elongate channels substantially parallel to said axes, between said internal and external surfaces and between adjacent lines of contact. Said channels are dimensioned to promote capillary action for molten solder at a channel opening on one side of said first substrate to cause the solder to be drawn through said channel towards the opposite side of said first substrate. A second substantially flat substrate is provided for positioning solder at points substantially aligned with points on said predetermined array and proximate to at least one channel in at least one plated-through hole prior to melting of the solder. In this manner, melting of the solder causes the solder to flow into said at least one channel in said at least one plated-through hole and to urge said second substrate to be drawn towards said first substrate to provide a reliable solder joint with said pin and said plated-through hole. In the presently preferred embodiments said second substrate provides solder aligned with all said channels of all said plated-through holes in said predetermined array.

BRIEF DESCRIPTION OF THE DRAWINGS

With the above and additional objects and advantages in view, as will hereinafter appear, this invention comprises the devices, combinations and arrangements of parts hereinafter described by way of example and illustrated in the accompanying drawings of preferred embodiments in which.

DESCRIPTION OF THE PREFERRED EMBODIMENTS

Figure 1:
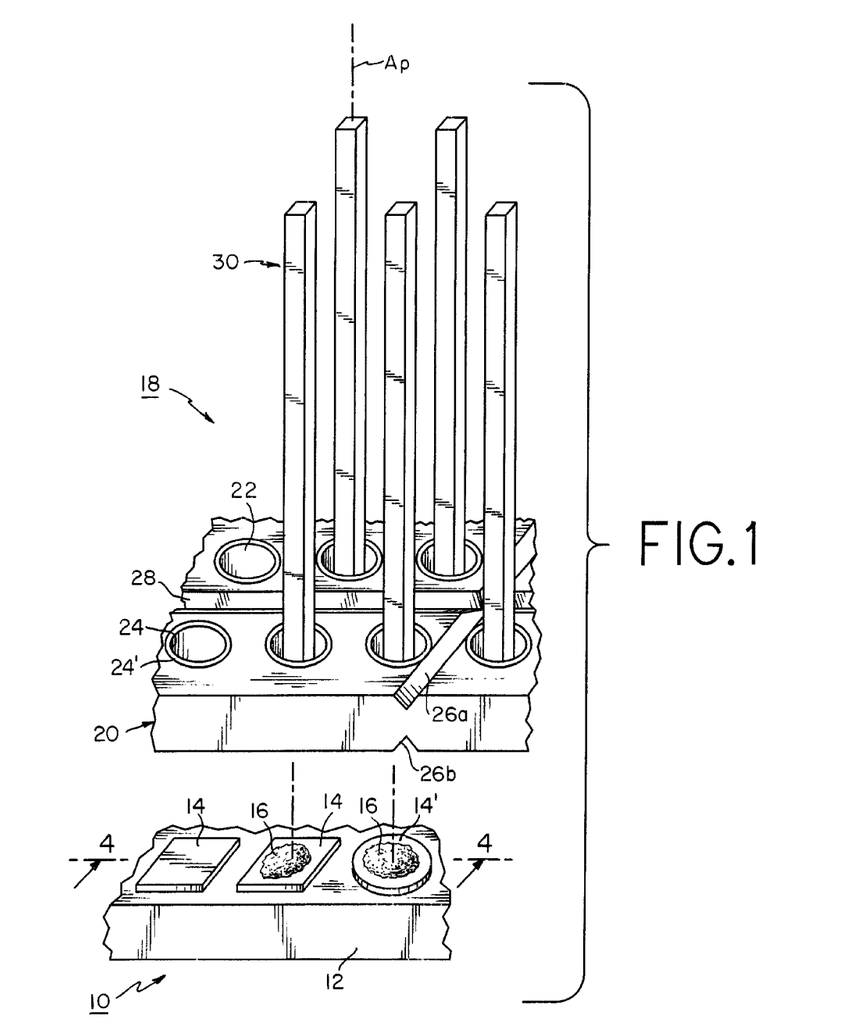
FIG. 1 is an exploded view, in perspective, of a capillary action enhanced surface mount pin header assembly in accordance with the present invention, shown in a position just prior to placement of the header supporting the contact pins on aligned lands or pads of a printed circuit board (PCB) on which solder paste has been applied prior to re-flow.

Referring now specifically to the FIGURES, in which similar or identical parts are designated by the same reference numerals throughout, and first referring to FIG. 1, a conventional printed circuit board (PCB) is generally designated by the reference numeral 10. The printed circuit board 10 includes a non-conductive substrate 12 on one surface of which there are provided a plurality of conductive lands or pads 14. While the lands or pads 14 are shown as being square, the specific configurations of these flat conductive lands or pads is not critical for purposes of the present invention and may have different shapes or configurations such as, for example, being round, as indicated at 14'. Solder paste typically placed on the top surfaces of such lands or pads 14 is designated by the reference numeral 16. The solder paste 16 presents a generally tacky surface which helps to retain components placed into contact therewith, prior to re-solder.

Figures 2, 3, 4:
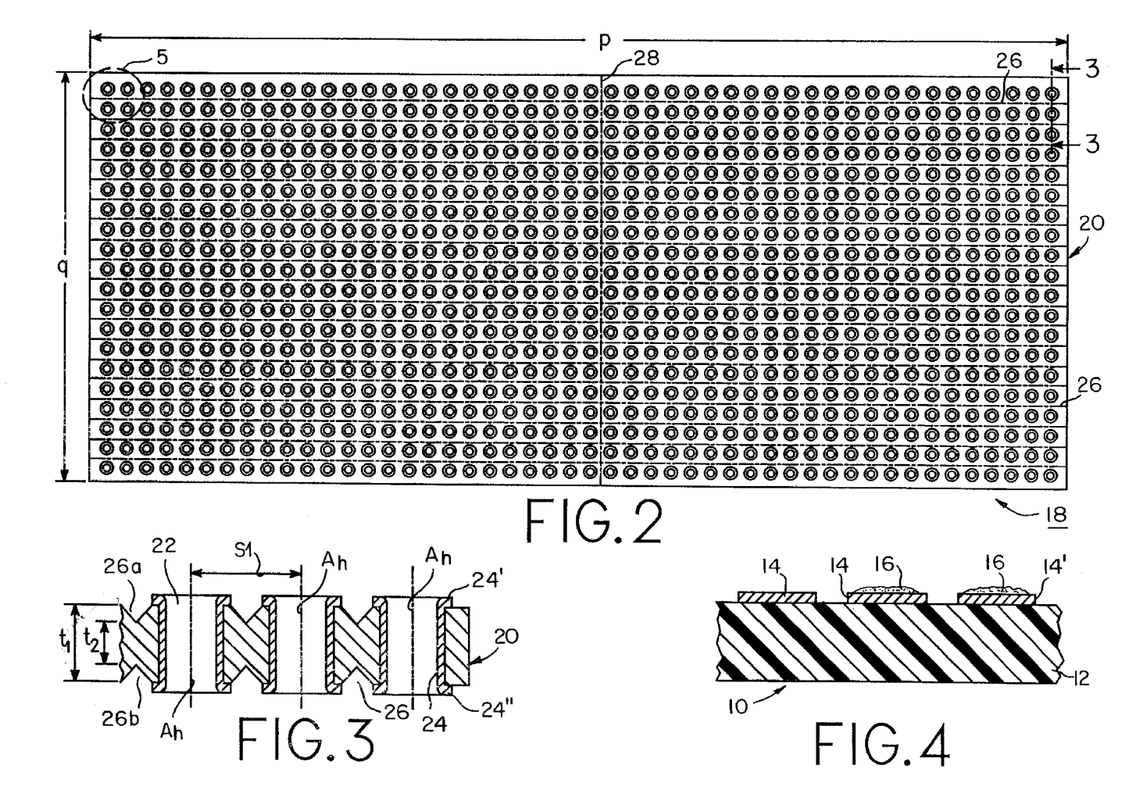
FIG. 2 is a top plan view of a header circuit board in accordance with the present invention in which plated-through holes are arranged in a rectilinear array of "p" columns and "q" rows.
FIG. 3 is a cross sectional view of the header shown in FIG. 2, taken along line 3—3.
FIG. 4 is a cross sectional view of a portion of the printed circuit, on which the header is placed, shown in FIG. 1, taken along line 4—4.

An important feature of the present invention is the provision of a header assembly 18 that includes a second substantially flat substrate 20 provided with a plurality of holes 22 that are plated, at 24, interiorly of the holes, the holes 22 having substantially parallel axes $A_h$ (FIG. 3). In the embodiment shown, each of the holes has an internal surface defining a substantially uniform circular cross section.

The substrate 20 is preferably at least partially flexible. Such flexibility may either be inherent as a result of the specific material from which the substrate 20 is formed or, if made of a rigid material, may be provided with score lines 26a, 26b, on both sides of the substrate as shown. Also, while the score lines 26a, 26b extend along one direction, additional score lines 28 may be provided in orthogonal/normal or other directions to render the substrate flexible. The score lines may be formed on one or both sides of the substrate 20. Further, while only two score lines are shown in FIG. 1, it should be clear that as many or as few score lines as desired can be provided. Thus, with reference to FIG. 2, a single score line 26 is shown extending across the short dimension of the header substrate 20, approximately midway between the two short sides, while score lines 28 are provided between each pair of adjacent rows. Clearly, the deeper and the more score lines provided, the more flexible the substrate of the header becomes, to render it more conforming to the primary printed circuit board 10, to accommodate any warpage within such board or warpage within the header substrate 20 itself As best illustrated in FIG. 2, the plated-through holes 22 are arranged on the header substrate 20 in a predetermined array, the array illustrated being a rectilinear array in which there are "p" columns and "q" rows. However, it should be clear that different arrays, such as circular, elliptical or other arrays, may be used to suit a given application, with different degrees of advantage. The rectilinear array of the type illustrated is, however, the more common array which lends itself to most applications.

Figure 5:
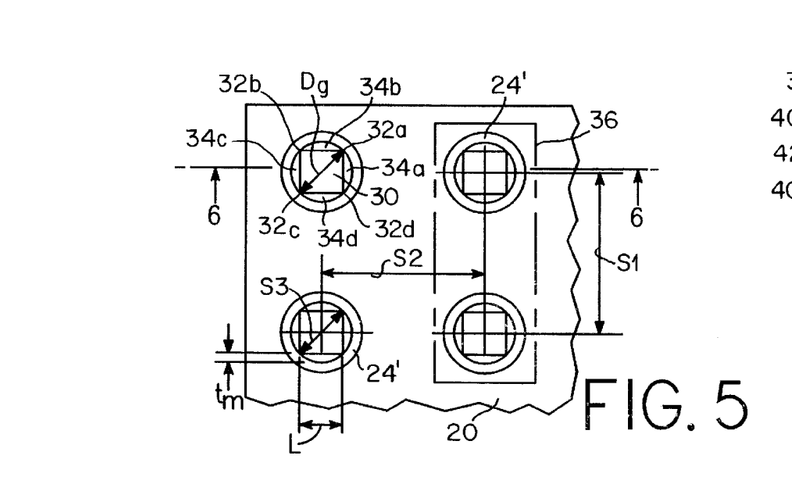
FIG. 5 is an enlarged section of the header shown in FIG. 2, at "5", further showing the details of the geometrical and dimensional relationships between the plated-through holes and the contact pins positioned therein to produce the channels therebetween that enhance or promote capillary action through the header.
Figure 6:
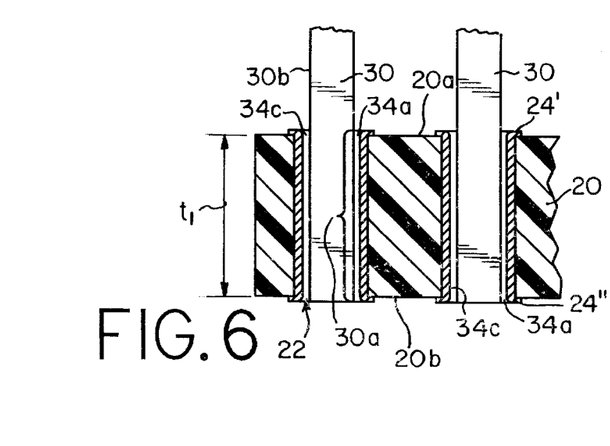
FIG. 6 is a cross sectional view of the header shown in FIG. 5, taken along line 6—6.
Figure 8:
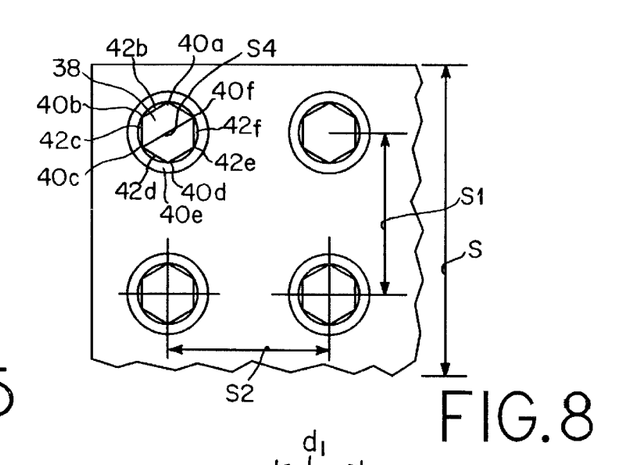
FIG. 8 is similar to FIG. 5 but showing pins having hexagonal cross sections instead of square or rectangular cross sections to change to sizes and numbers of solder absorbing channels formed between each plated-through hole and associated pin.

Referring to FIG. 1, a plurality of pins 30 are shown each defining a longitudinal axis $A_p$ and having one end 30a (FIG. 6) extending through an associated plated-through hole 22 and another end 30b extending from one side 20a (the upper surface in FIG. 6) of the header substrate. Each pin 30 has an external surface on at least the portion 30a that is received within an associated plated-through hole 22 that defines a substantially uniform cross section. In FIGS. 1, 5 and 6, such cross section is uniformly square throughout the length of the pin. However, pin sections 30a and 30b may also have different cross sections. Thus, the lower portion of the pins 30a can have a square cross section as shown FIG. 5 or an octagonal cross section as shown in FIG. 8 or generally be in the shape of any regular polygon to mate in a desired manner with the cylindrical plating 24 in the holes 22. The upper portions 30b of the pins, on the other hand, are designed to mate with corresponding, female connectors and the cross sections of the pins 30 may be selected to better mate with their female counterparts. Thus, by way of example only, the lower portions 30a may have square cross sections while the upper portions 30b may have circular cross sections.

It is clear particularly from FIGS. 5 and 8 that the cross sections of the plated-through holes and the cross sections of the inserted pin portions 30a are different, the dimensions of the internal surface of the plated-through holes 22 and the external dimensions of the pins being selected so that the pins can be inserted into the plated-through holes with at least some interference fit to provide spaced lines of contact 32a–32d, in the case of the arrangement shown in FIG. 5, that are substantially parallel to the axes $A_h$ of the holes. The resulting elongate channels 34a–34d are likewise substantially parallel to said axes $A_h$ of the plated-through holes. The channels 34a–34d are created between the internal surfaces of the plated-through holes and the external surfaces of the pin and between the adjacent lines of contact 32a–32d. The dimensions of the resulting channels 34a–34d are selected to promote capillary action of molten solder placed at a channel opening on one side 20b of the header substrate 20 to cause the solder to be drawn through the channel towards the opposite side 20a of such substrate. As suggested in FIG. 1, when solder paste 16 is placed on the lower side of the header substrate 20, melting of the solder 16 on the PCB 10 causes the solder to wick up through the channels 34a–34d. Depending on various factors, including the dimensions of the channels 34a–34d, the thickness $t_1$ of the header substrate 20, temperature, etc., the solder should actually rise above the level of the top surface 20a of the header substrate 20 to create a mound or fillet 16b, filling the channels with solder at 16a. The mound or fillet 16b provides a visual indication that the solder has wicked upwardly through the channels 34a–34d and has created both a good mechanical and electrical connection.

As suggested, the primary printed circuit board 10 includes conductive lands or pads 14 on the substrate 12 positioned at points substantially aligned with points on the array of plated-through holes and pins on the header substrate 20. By providing corresponding or mating arrays on the two substrates, solder on the pads 14 is wicked up through the channels of the associated holes. This wicking or capillary action causes the substrates 12 and 20 to be drawn towards other while the solder redistributes itself from the pads 14 to the channels created in the header substrate to provide reliable solder joints with the pins 30 and the plated-through holes 22.

In the example shown in FIG. 2, the spacings between adjacent rows and adjacent columns are substantially equal. In this example, the spacing S1 between adjacent rows is approximately 0.1", and the spacing S2 between adjacent columns is likewise 0.1". However, clearly these dimensions S1, S2 can be changed to satisfy any given application.

As suggested, when the cross section of at least the lower portion 30a of the pin 30 is square and that of the hole 22 is circular at least the edges of the pin 30, at 32a–32d, are in contact, preferably in press fit contact, with the internal surface of the plated-through hole. This requires that the diagonal S3 of the pin 30 substantially correspond to or slightly exceed the internal diameter $D_i$ of the plated portion 24. The same is true for any inscribed regular polygon, such as the polygonal cross section of the pin 38 shown in FIG. 8. Here, although there are six surfaces defining six edges 40a–40f, the diagonal S4 of the hexagon may be equal to the diagonal S3 of the square pin, and the edges are preferably in press fit contact with the internal surface of the plated-through hole by selecting the diagonal S4 extending across opposing edges to substantially correspond to the diameter D of the plated-through hole. The more the sides of the regular polygon inscribed within the circle, the resulting smaller the resulting channels 42a–42f become, although they are, clearly, the same axial length ($t_1$) as the channels 34a–34d. It will also be evident that the more sides in the polygon defining the cross sectional area of the pin, the smaller the dimensions of the resulting channels for wicking up and receiving the molten solder, although the diagonals $D_p$ of the polygon remain the same.

Thus, it can be shown that for a pin having a uniform cross section in the shape of a regular polygon having "n" sides, the maximum thickness $t_m$ (FIG. 5) of the resulting channels is $$t_m \cong (D_p/2)[1-\cos(180/n)],$$

where $D_p$ is the length of the diagonal of the polygon, and the width of the channels is:

$$L \cong D_p[\sin(180/n)].$$

For the square pin shown (n=4) having 0.25" on a side $D_p$=0.035", and $t_m \cong 0.052$" and L$\cong$0.025". For the hexagon cross section in FIG. 8, with n=6, $t_m \cong 0.0024$" and L$\cong$0.0175". In the square pin embodiment, a substrate height $t_1 \cong 0.063$" has been found to provide good results where the holes 22 are tin plated with an initial diameter of about 0.027 inches, slightly undersized for the calculated dimension of the diagonal $D_p$ of the square cross section to provide a press fit when the sharp corners of the pin 30 displace the plated metal when the pin is forced into the hole. As a result, the actual values for $t_m$ and L will, in actuality, be somewhat smaller than the computed values. However, values for $t_m$, L and $t_1$ on the order of magnitudes above set forth are acceptable and will provide the wicking or capillary action in accordance with the invention.

It will also be evident to those skilled in the art that although the cross sections of the plated-through holes 22 have been shown to be circular and the cross sections of the pin portions 30a, received within the holes, have been shown having cross sections corresponding to regular polygons, the reverse configurations can also be used. Thus, the plated-through holes could be provided with cross sections in the shapes of regular polygons while the pin portions received therein could have circular cross sections. Any other cross sections which will enable the pins to be press fit within the holes, on the one hand, and create channels as aforementioned, on the other hand, which will promote wicking of the solder by capillary action to fill the resulting channels between the plated-through hole internal surface and the external surfaces of the pin could be used. Such alternate constructions, however, may be less practical and more costly, as it is typically very simple and inexpensive to create circular holes within printed circuit boards. Therefore, while one arrangement or the other may be preferable in any given instance, the different approaches will exhibit different degrees of advantage.

Figure 7:
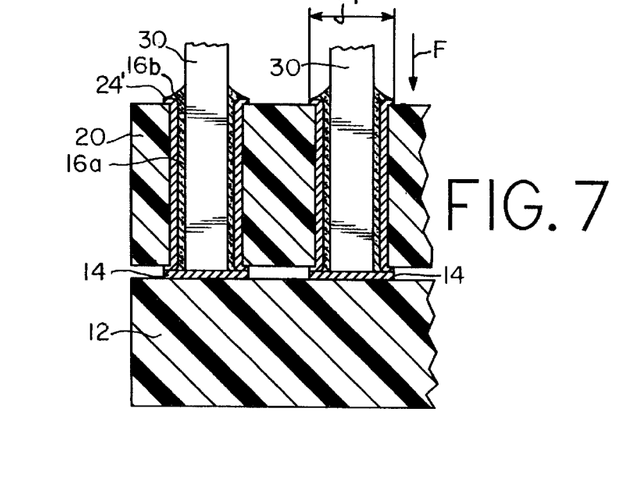
FIG. 7 is similar to FIG. 6 but showing a portion of the header after being mounted on a section of the substrate of the printed circuit board and after solder re-flow which has resulted in solder flow rise through the resulting channels in the header.

As best shown in FIGS. 3 and 6, the generally cylindrical plated portions 24 coating the inside surfaces of the holes 22 are preferably provided with annular ridges or rings 24', 24" which extend the plating 24 radially outwardly beyond the diameter of the holes 22 at both the upper and lower surfaces of the substrate 20. These annular rings or ridges promote the flow, by capillary action, of the molten solder above the surfaces of the header 20 to form the mounds or fillets 16b, as aforementioned in connection with FIG. 7. Such fillets provide a visible indication of successful wicking of the solder through the chambers at 16a and good physical and electrical connection between the plated-through holes with the pads 14 as well as with the pins 30.

Figure 9:
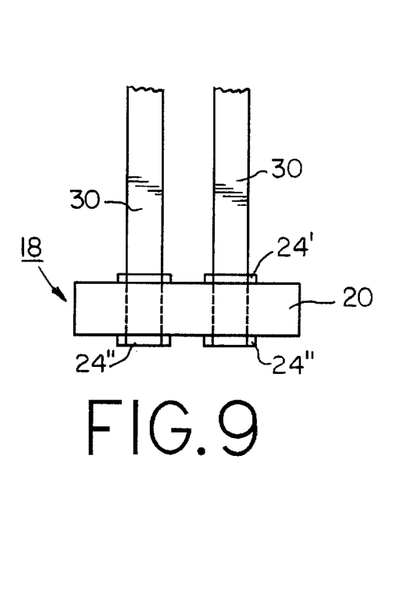
FIG. 9 is similar to FIG. 6, illustrating two pins or posts received within a header substrate in accordance with the invention in which the lower ends of the pins or posts extending substantially to the bottom surface of the header.
Figure 10:
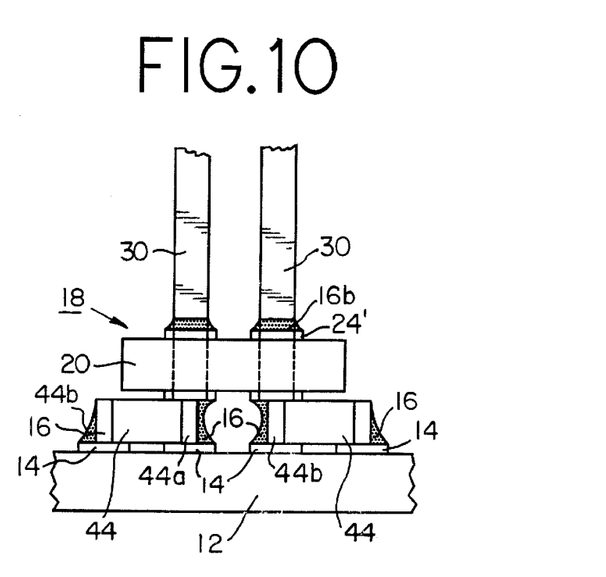
FIG. 10 illustrates one manner of using the header of FIG. 9 in which plated-through holes the header are placed on and soldered to electronic components placed on pads or lands on the underlying printed circuit board substrate, so that the electronic components are soldered both to the substrate and the underlying printed circuit board, while still promoting capillary action in accordance with the invention.

Referring to FIGS. 9 and 10, the lower portions 30a of the pins are shown to extend through but not beyond the holes 22, so that the pins do not project below the annular ridges or rings 24. In FIG. 10, a further application of the header assembly 18 is illustrated in which electrical components 44, such as resistors or capacitors, having conductive terminals 44a, 44b may be placed directly on the lands or pads 14 of the primary printed circuit board 10 with the header assembly 18 being placed over the electrical components 44 and so aligned that the axes of the pins or posts $A_p$ and the axes of the plated-through holes $A_h$ substantially coincide with the conductive contacts or terminals 44a, 44b. In this manner, application of solder paste 16 both to the pads 14 as well as to the terminals or contacts 44a, 44b allows the header assembly 18 to be placed directly on the electrical components 44. By selecting the spacings between the pads or lands 14 and the sizes of the electrical components 44 it is possible to achieve the capillary action of solder placed on the electrical components 44 which wicks up into the channels formed within the header assembly, as aforementioned in connection with FIG. 7, or at least into one or more of the channels sufficient to provide an acceptable electrical and mechanical connection.

Figure 11:
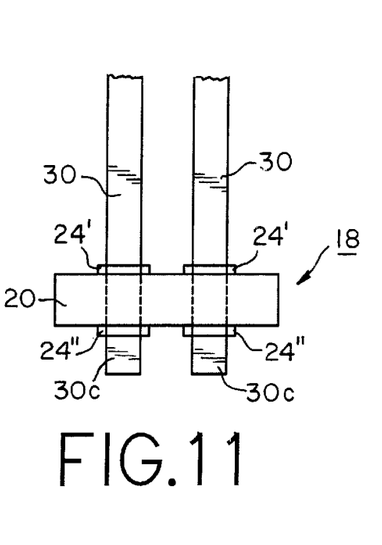
FIG. 11 is similar to FIG. 9 but illustrating the ends of the pins or posts inserted into the header extending below the header substrate.
Figure 12:
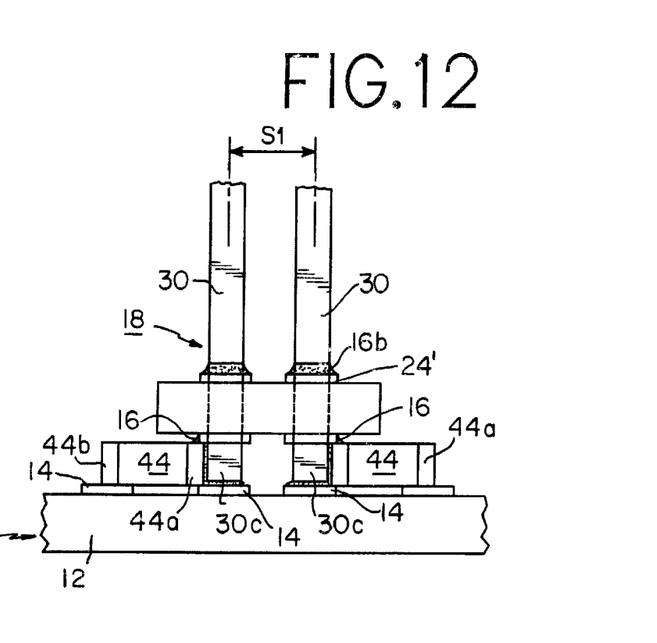
FIG. 12 is similar to FIG. 9, but illustrating the pin or post arrangement of FIG. 11, in which the depending portions of the pins or posts may also be directly attached to the intermediate electronic components and/or to the lands or pads on the underlying printed circuit board.
Figure 13:
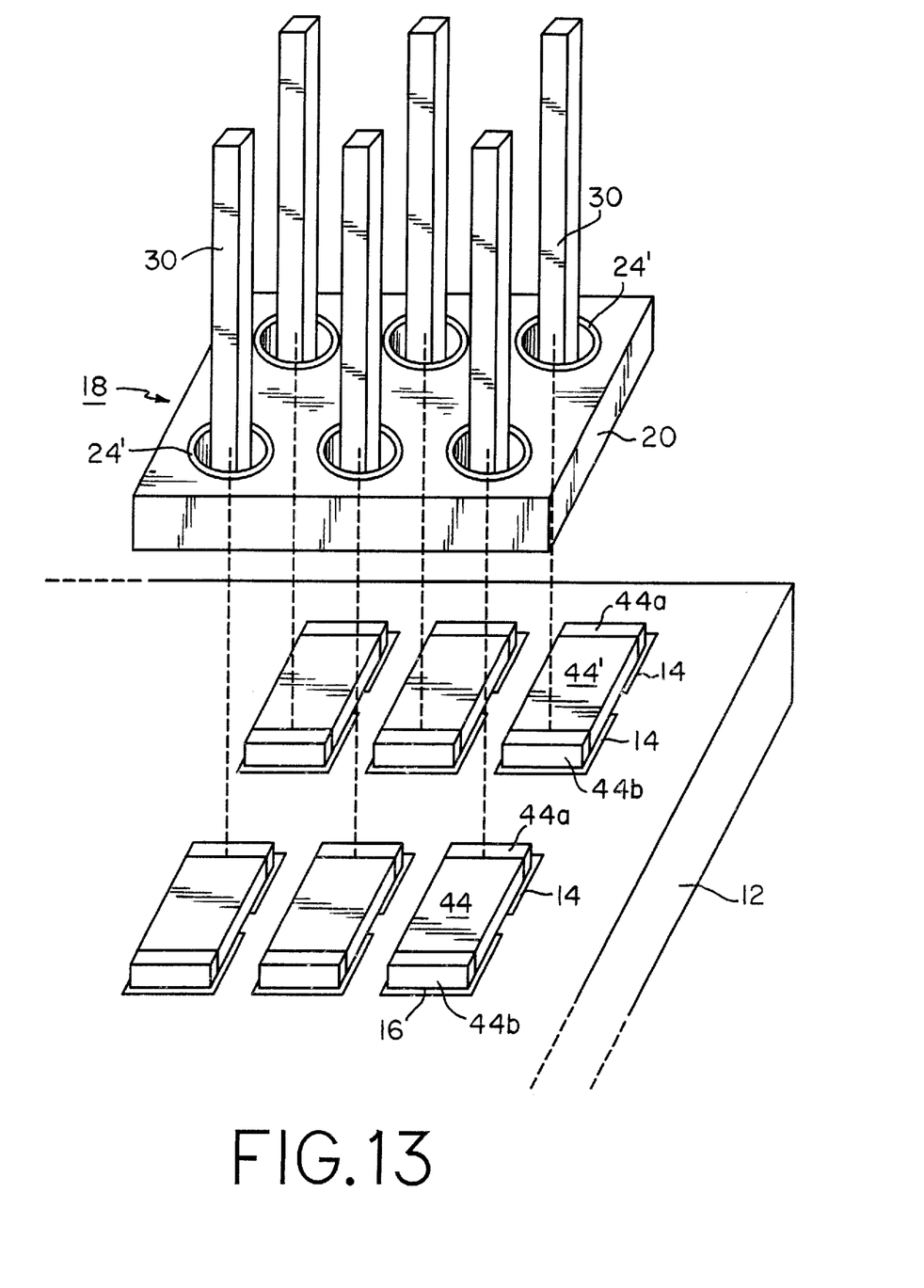
FIG. 13 is an exploded view, in perspective, similar to FIG. 1, in which the header assembly of the type shown in FIGS. 9 and 11 is attached to the underlying printed circuit board on which electronic components have been previously positioned or mounted.

Referring to FIGS. 11 and 12, a similar arrangement is shown as in FIGS. 9 and 10, with the exception that the pins 30 have portions 30c thereof extending below the plated-through holes 22 and below the annular rings or ridges 24". As indicated in FIG. 12, such a header assembly 18' may likewise be mounted on the substrate 12 of the printed circuit board 10 as long as the extended portions 30c do not exceed the thicknesses or heights of the electrical components 44 so that the substrate 20 of the header assembly may still rest and be in contact terminals of with the electrical components and the solder placed thereon. FIG. 13 provides another illustration of how the headers shown in FIGS. 9–12 may be mounted on the substrate 12 of the printed circuit board by first placing the electrical components 44 on the pads 16 and subsequently placing the substrate 20 of the header assembly 18' on the contacts or terminals 44a, 44b of the electrical components.

Aside from the application shown in FIGS. 11 and 12, the ends of the pins are normally flush with the bottom of the header printed circuit board or substrate 20. The extensions 30c shown in FIGS. 11 and 12 are not normally necessary to support the pins within the plated-through holes since the sizes of the holes, as described, are such that they firmly hold the pins in a press fit or friction fit relationship. The resulting cavities or channels are dimensioned to promoted capillary action as aforementioned.

The score lines 26a, 26b and 28 may be shallow or very deep and run across one or both sides of the header substrate 20 to make that board flexible.

The printed circuit board 10 should have surface mount solder pads 14 of comparable and must be located at the same pitch as the plated-through holes 22. Thus, the arrangement and spacing of the pads 14 define an array which corresponds to the array of the plated-through holes in the header assembly 18. The solder paste 16 is stenciled over the pads 14 on the printed circuit board 10, and the header assembly 18 is placed over the solder paste in such a way that the solder pads 14 on the PCB 10 and the annular ridges or rings 24" on the bottom of the substrate 20 substantially align. When the solder paste 16 heats and re-flows in the oven, the capillary action provided by the four cavities 34a–34d in FIG. 5, around the pin, will draw most of the melted solder and fix the pin in an associated plated-through hole at the same time that it solders the header assembly in the PCB. The force F (FIG. 7), which results from the wicking of the melted solder into the cavities will also draw the header board assembly 18 and printed circuit board 10 together. Since the score lines make the PCB header assembly 18 flexible, it will conform to the shape of the printed circuit board 10, even if either or both of the boards are somewhat warped. The capillary action forces provide two additional benefits. First, they pull the header to the right position to be aligned with the solder pad even if it is initially placed off center. The wicking also produces a much stronger solder joint between the header and the PCB 10. Since solder is a very weak alloy, it is preferable to have the minimum amount of solder between the two surfaces between attached. The capillary action will siphon away all the excess solder, therefore making the solder joint much stronger. The melted solder will run up the plated-through hole to the top side 20a of the header assembly board 20 and form a ring around the pin 16b which indicates that the re-flow process is complete and ample solder was used. This provides a quick, easy visual inspection which assures proper quality of the process.

The instant invention provides all of the benefits of the stand alone pins disclosed in U.S. patent application Ser. No. 08/600,112. However, the header of the present invention also provides a large base for stability and, of course, substantially reduces the number of placements needed to populate the board. Typically, headers of this type include 6–48 or more pins arranged in single or double rows or more, although double rows are common because they accommodate simple jumpers or shunts as suggested at 36 in FIG. 5.

Whereas individual placement of pins typically runs approximately 0.05 cents per pin, the placement of surface mount (SMT) pins secured by a header assembly of the type disclosed can bring down the cost to approximately 0.01 cent per pin.

The present invention has a number of benefits, a primary one of which is approximately fifty percent higher pin retention compared with J-lead type surface mounted headers. The header assembly of the present invention minimizes co-planarity problems, board warpage being permissible and not critical to the proper and reliable mounting of the pin headers. By making the pin header substrates 20 relatively flexible, such flexibility compensates for warpage in either the substrate 12 of the main PCB or the substrate 20 of the header. The present invention results in more forgiving header placement tolerances. Capillary action forces pull the header into the correct position even if only half the header is initially placed on the solder pad of the PC board. This feature is especial beneficial if the header is placed or positioned on the PC board by hand. As indicated, the wicking of the solder into the channel and the formation of the annular mound or fillet provides a visible indicator that assures proper quality control. A solder ring around the pin on the top side of the header indicates perfect re-flow, that the right amount of solder paste was used and the header is in the right position on the board. The resulting reliable connections also provide in the highest resistance to thermal shock and thermal cycling. Since the board material and the header material are identical, there are no thermally induced stresses on the solder joint which guarantees long term reliability. Additionally, the header design of the present invention can optimize population density, resulting in minimal board real estate required.

While this invention has been described in detail with particular reference to a preferred embodiment thereof, it will be understood that variations and modifications will be effected within the spirit and scope of the invention as described herein and as defined in the appended claims.

What I claim is:

1. Capillary action enhanced surface mount pin mounting system comprising a first substantially flat substrate provided with a predetermined array of plated-through holes having substantially parallel axes and each having an internal surface defining a first substantially uniform cross section;

a plurality of pins each defining a longitudinal axis and having one end extending through an associated plated-through hole and another end extending to one side of said first substrate, each said pin having at least the portion thereof received within an associate plated-through hole and having an external surface defining a second substantially uniform cross section, said first and second cross sections being dissimilar and configured to provide spaced lines of contact and elongate channels substantially parallel to said axes, between said internal and external surfaces and adjacent lines of contact, dimensioned to promote capillary action for molten solder at a channel opening on one side of said first substrate to cause the solder to be drawn through said channel towards the opposite side of said first substrate;

and a second substantially flat substrate for positioning solder at points substantially aligned with said plated-through holes in said predetermined array substantially in connection at least one channel in at least one plated-through hole prior to melting of solder, said pins extending through said first substrate to a point adjacent to but without penetrating said second substrate, melting of the solder causing the solder on said second substrate to flow into said at least one channel in said at least one plated-through hole in said first substrate and urge said first substrate to be drawn towards said second substrate and to provide a secure surface mount solder joint with said pin and plated-through hole.

2. A mounting system as defined in claim 1, wherein said predetermined array of plated holes is defined by a rectilinear array of spaced parallel rows intersecting spaced parallel columns generally orthogonal to said rows, said plated-through holes being located at the intersection points of said rows and columns.

3. A mounting system as defined in claim 2, wherein the spacing between adjacent rows and adjacent columns is substantially equal.

4. A mounting system as defined in claim 3, wherein said spacing is approximately 0.1 inch.

5. A mounting system as defined in claim 1, wherein said first substrate is at least partially flexible.

6. A mounting system as defined in claim 1, wherein said first cross section is circular and said second cross section is square.

7. A mounting system as defined in claim 1, wherein said first cross section is square and said second cross section is circular.

8. A mounting system as defined in claim 1, wherein said first cross section is octagonal and said second cross section is circular.

9. A mounting system as defined in claim 1, wherein at least one of cross sections is a regular polygon.

10. A mounting system as defined in claim 1, wherein said pins have a uniform cross section substantially along the entire length thereof.

11. A mounting system as defined in claim 1, wherein said second substrate is a printed circuit board provided with an array of conductive lands or pads that substantially corresponds to said predetermined array.

12. A mounting system as defined in claim 11, wherein said conductive lands or pads are square.

13. A mounting system as defined in claim 11, wherein said conductive lands or pads are circular.

14. A mounting system as defined in claim 1, wherein said pins extend through and beyond said plated-through holes.

15. A mounting system as defined in claim 1, wherein said plated-through holes include plating on said internal surface which extends beyond said internal surface to form at least one substantially annular ring in a plane(s) of said first substrate normal to said axes.

16. A mounting system as defined in claim 15, wherein annular rings are formed at each end of each plated-through hole.

17. Capillary action enhanced surface mount pin header comprising a first substantially flat substrate provided with a predetermined array of plated-through holes having substantially parallel axes and each having an internal surface defining a first substantially uniform cross section; a plurality of pins each defining a longitudinal axis and having one end extending through an associated plated-through hole and another end extending to one side of said first substrate, each said pin having an external surface on at least the portion thereof received within an associated plated-through hole and defining a second substantially uniform cross section, said first and second cross sections being dissimilar and configured to provide spaced lines of contact and elongate channels substantially parallel to said axes, between said internal and external surfaces and adjacent lines of contact, dimensioned to promote capillary action for molten solder at a channel opening on one side of said first substrate; and a second substantially flat substrate for positioning solder at points substantially aligned with points on said predetermined array and proximate to at least one channel in at least one plated-through hole prior to the melting of the solder, whereby melting of the solder causes the solder to flow into said at least one channel in said at least one plated-through hole and urge said second substrate to be drawn towards said first substrate and to provide a reliable solder joint with said pin and plated-through hole, said predetermined array being a rectilinear array of spaced parallel rows intersecting spaced parallel columns general orthogonal to said rows, said plated-through holes being located at the intersection points of said rows and columns, and at least one score line extending between two adjacent rows to enhance flexibility along a direction substantially parallel to said columns.

18. Capillary action enhanced surface mount pin header comprising a first substantially flat substrate provided with a predetermined array of plated-through holes having substantially parallel axes and each having an internal surface defining a first substantially uniform cross section; a plurality of pins each defining a longitudinal axis and having one end extending through an associated plated-through hole and another end extending to one side of said first substrate, each said pin having an external surface on at least the portion thereof received within an associated plated-through hole and defining a second substantially uniform cross section, said first and second cross sections being dissimilar and configured to provide spaced lines of contact and elongate channels substantially parallel to said axes, between said internal and external surfaces and adjacent lines of contact, dimensioned to promote capillary action for molten solder at a channel opening on one side of said first substrate; and a second substantially flat substrate for positioning solder at points substantially aligned with points on said predetermined array and proximate to at least one channel in at least one plated-through hole prior to the melting of the solder, whereby melting of the solder causes the solder to flow into said at least one channel in said at least one plated-through hole and urge said second substrate to be drawn towards said first substrate and to provide a reliable solder joint with said pin and plated-through hole, said predetermined array being a rectilinear array of spaced parallel rows intersecting spaced parallel columns general orthogonal to said rows, said plated-through holes being located at the intersection points of said rows and columns, and at least one score line extending between two adjacent columns to enhance flexibility along a direction substantially parallel to said rows.

19. Capillary action enhanced surface mount pin header comprising a first substantially flat substrate provided with a predetermined array of plated-through holes having substantially parallel axes and each having an internal surface defining a first substantially uniform cross section; a plurality of pins each defining a longitudinal axis and having one end extending through an associated plated-through hole and another end extending to one side of said first substrate, each said pin having an external surface on at least the portion thereof received within an associated plated-through hole and defining a second substantially uniform cross section, said first and second cross sections being dissimilar and configured to provide spaced lines of contact and elongate channels substantially parallel to said axes, between said internal and external surfaces and adjacent lines of contact, dimensioned to promote capillary action for molten solder at a channel opening on one side of said first substrate; and a second substantially flat substrate for positioning solder at points substantially aligned with points on said predetermined array and proximate to at least one channel in at least one plated-through hole prior to the melting of the solder, whereby melting of the solder causes the solder to flow into said at least one channel in said at least one plated-through hole and urge said second substrate to be drawn towards said first substrate and to provide a reliable solder joint with said pin and plated-through hole, said first cross section being circular and said second cross section being hexagonal.

20. Capillary action enhanced surface mount pin header comprising a first substantially flat substrate provided with a predetermined array of plated-through holes having substantially parallel axes and each having an internal surface defining a first substantially uniform cross section; a plurality of pins each defining a longitudinal axis and having one end extending through an associated plated-through hole and another end extending to one side of said first substrate, each said pin having an external surface on at least the portion thereof received within an associated plated-through hole and defining a second substantially uniform cross section, said first and second cross sections being dissimilar and configured to provide spaced lines of contact and elongate channels substantially parallel to said axes, between said internal and external surfaces and adjacent lines of contact, dimensioned to promote capillary action for molten solder at a channel opening on one side of said first substrate, and a second substantially flat substrate for positioning solder at points substantially aligned with points on said predetermined array and proximate to at least one channel in at least one plated-through hole prior to the melting of the solder, whereby melting of the solder causes the solder to flow into said at least one channel in said at least one plated-through hole and urge said second substrate to be drawn towards said first substrate and to provide a reliable solder joint with said pin and plated-through hole, said second substrate including lands or pads and being spaced from said first substrate and at least one electronic component is mounted on said lands or pads soldered to both substrates.

* * * * *